United States Patent
Price

(10) Patent No.: US 6,205,030 B1
(45) Date of Patent: Mar. 20, 2001

(54) EXTERNAL FUSE ACCESS FOR PC CARD

(75) Inventor: Tim Urry Price, Salt Lake City, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/320,487

(22) Filed: May 26, 1999

(51) Int. Cl.[7] .............................. H05K 7/00; H01R 13/68
(52) U.S. Cl. .................. 361/737; 361/736; 361/837; 439/621; 235/492; 337/1
(58) Field of Search .................................... 361/728, 736, 361/737, 837; 439/621, 946; 235/492; 174/135; 337/1

(56) References Cited

U.S. PATENT DOCUMENTS

| | | |
|---|---|---|
| 5,086,216 | 2/1992 | Mollet et al. . |
| 5,151,774 * | 9/1992 | Mori et al. .............................. 257/79 |
| 5,309,625 | 5/1994 | Onishi . |
| 5,526,233 * | 6/1996 | Hayakawa ............................ 361/737 |
| 5,777,836 | 7/1998 | Price et al. . |
| 5,780,775 * | 7/1998 | Yu ........................................ 174/135 |
| 5,980,322 * | 11/1999 | Madsen et al. ...................... 439/621 |

\* cited by examiner

*Primary Examiner*—Jayprakash N. Gandhi
(74) *Attorney, Agent, or Firm*—Workman, Nydegger & Seeley

(57) ABSTRACT

A PC card includes a housing bounding a compartment. The housing includes a top cover plate, a bottom cover plate, and a border frame extending therebetween. A circuit board having electrical circuitry formed thereon is disposed within the compartment of the housing. An electrical connector configured for coupling with an electrical apparatus is mounted on the housing in electrical communication with the circuit board. A fuse slot is formed at least partially on the border frame and is configured to removably receive a fuse. The fuse slot communicates with the exterior through an opening. Disposed within the fuse slot are spaced apart first and second fuse contacts. The fuse contacts are each disposed in electrical communication with the circuit board. The fuse contacts are also configured to engage the fuse in electrical communication when the fuse is received within the fuse slot.

20 Claims, 4 Drawing Sheets

EXTERNAL FUSE ACCESS FOR PC CARD

BACKGROUND OF THE INVENTION

1. The Field of the Invention

The present invention relates to PC cards and, more specifically, PC cards having external fuse access.

2. Present State of the Art

PC cards are used with electrical apparatus, such as personal computers, for assisting the electrical apparatus in performing a desired function. For example, one conventional type of PC card comprises a modem card. The modem card enables a personal communication to receive and transmit information over a telephone line. Other conventional types of PC cards include memory cards and network cards. Most PC cards are manufactured under set standards identified as PCMCIA. The standards differ depending on the type and intended function of the card. A conventional PC card includes a thin, low profile housing which bounds a circuit board. Positioned at one end of the PC card is a connector, typically a pin connector, for electrically coupling the PC card to a computer or other electrical apparatus. Formed on the opposing end of the PC card is an electrical coupler for mechanically and electrically coupling with a cable, such as a telephone line or network line.

Mounted on the circuit board of most PC cards is a fuse. When a power surge, electrical short, or other irregular or nonstandard voltage is applied to the circuit board through one of the connectors, the fuse is blown or burned out so as to protect the circuit board. The fuse also protects the electrical apparatus to which the current will subsequently flow. Although blowing the fuse is effective in preventing further damage, it is also problematic. For example, PC cards are typically sealed closed during the manufacture process. As a result, once a fuse is blown, the PC card must either be returned to the factory for replacement of the fuse or the PC card is simply disposed of and replaced with a new PC card. Neither approach is very cost-effective. Furthermore, blowing the fuse deactivates the PC card and thus shuts down the operation thereof until the fuse is replaced.

OBJECTS AND BRIEF SUMMARY OF THE INVENTION

Accordingly, it is an object of the present invention to provide PC cards having a fuse in electrical communication with the circuit board thereof.

Another object of the present invention is to provide PC cards as above wherein the fuse is accessible by the purchasing public for easy replacement.

Yet another objection of the present invention is to provide a PC cards as above wherein the fuse can be replaced without the need for substantial disassembling of the PC card.

To achieve the foregoing objects, and in accordance with the invention as embodied and broadly described herein, an inventive PC card is provided. The PC card includes a housing bounding a compartment. The housing includes a top cover plate, a bottom cover plate, and a border frame extending therebetween. A circuit board having electrical circuitry formed thereon is disposed within the compartment of the housing. An electrical connector configured for coupling with an electrical apparatus is mounted on the housing in electrical communication with the circuit board.

The inventive PC card also includes means for housing a fuse in electrical communication with the circuit board such that the fuse can be selectively removed and replaced without disassembly of housing. In general terms, the means for housing the fuse includes a fuse slot formed on the PC card. The fuse slot communicates with the exterior through an opening and is configured to receive a fuse. The fuse slot can be formed at a variety of different locations such as on the border frame or between the circuit board and one of the cover plates.

Disposed within the fuse slot is a pair of spaced apart fuse contacts. Each of the fuse contacts are disposed in electrical communication with the circuit board. The fuse contacts are configured to engage opposing ends of the fuse so that the circuit board is in electrical communication the fuse when the fuse is disposed within the fuse slot. When a power surge or unspecified voltage is applied to the circuit board, the fuse is burned out or otherwise blown, thereby preventing damage to the circuit board and the electrical lines and equipment coupled therewith One of the unique features of the present invention is that the burned out fuse can be easily and quickly replaced by the average consumer without the need for substantial disassembly of the PC card. That is, by using a knife, screw driver, or other corresponding tool, the fuse can be accessed and removed through the opening of the fuse slot. A new fuse can then be inserted, thereby putting the PC card back in operation.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
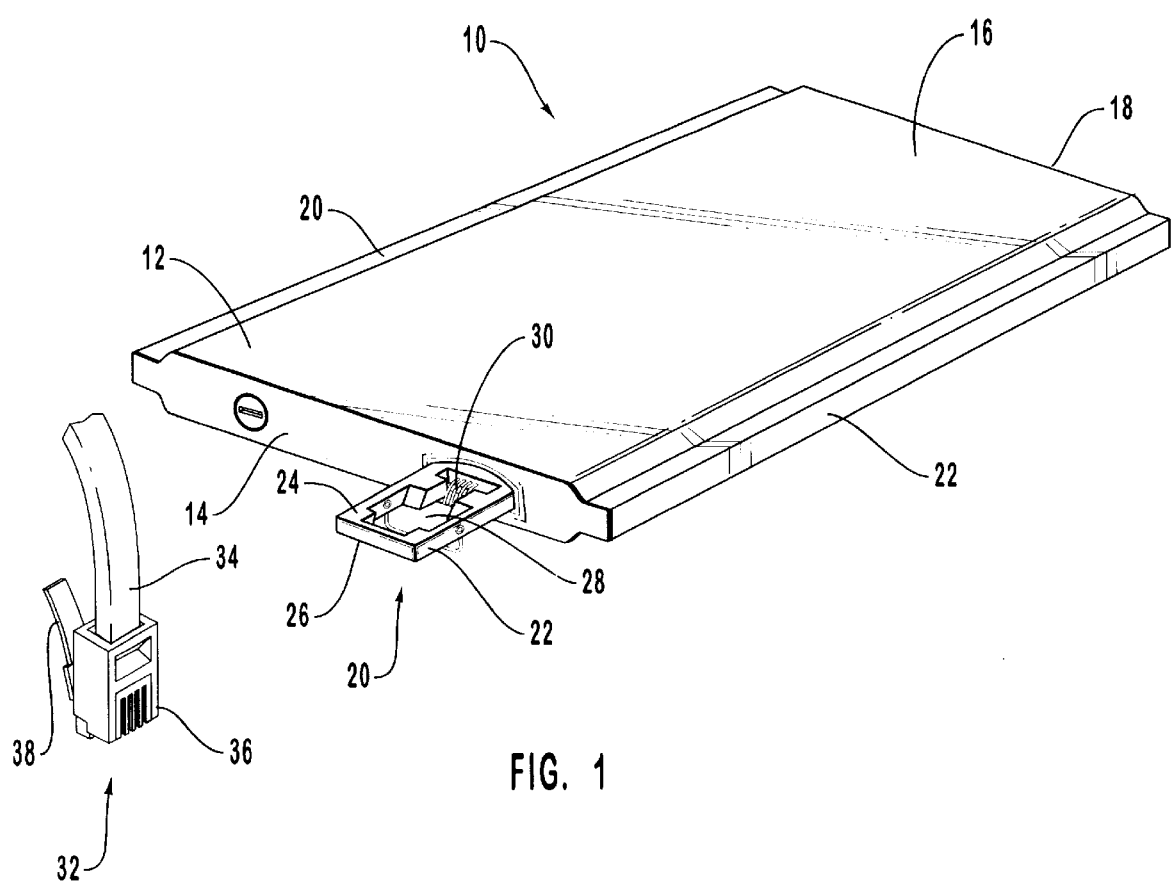
FIG. 1 is a perspective view of an inventive PC card.

Depicted in FIG. 1 is one embodiment of a PC card 10 incorporating features of the present invention. As used in the specification and appended claims, the term "PC card" is broadly intended to include all types of cards which currently or may in the future fall under PCMCIA standards such as type I–IV cards. PC cards also include cards which fall outside of the PCMCIA standards but function in a similar manner. Examples of PC cards include network cards, modem cards, memory cards, and other cards which are adapted for assisting electrical apparatus to perform a specific function. PC card 10 has a front end 12 that terminates at a front face 14 and an opposing back end 16 that terminates at a back face 18. Extending between front end 12 and opposing back end 16 are opposing sides 20 and 22.

In one embodiment of the present invention, means are provided for facilitating electrical communication between PC card 10 and an electrical cable. By way of example and not by limitation, depicted in FIG. 1 is a retractable jack 20. Retractable jack 20 comprises a relatively thin slide plate 22. Slide plate 22 has a top surface 24, an opposing bottom surface 26, and an aperture 28 extending therebetween. Projecting into aperture 28 are a plurality of contact pins 30. Retractable jack 20 is moveable between an extended position as depicted in FIG. 1, wherein aperture 28 is openly exposed, and a retracted position wherein aperture 28 is substantially enclosed within PC card 10.

Aperture 28 is configured to both physically and electrically coupled with a media plug 32. Media plug 32 is in electrical communication with an electrical cable 34 and includes a body 36 having a flexible prong 38 attached thereto. As used in the specification and appended claims, the term "media plug" is broadly intended to include RJ-type plugs such as RJ-11, RJ-45, and other RJ-type plugs which currently exist or will be developed in the future under new standards.

An alternative embodiment of the means for facilitating electrical communication between PC card 10 and an electrical cable includes the use of conventional card edge connectors Card edge connectors include a socket formed on the edge of the PC card and an plug, often called a dongle, configured to engage the socket in electrical communication. The plug has an electrical cable, such as a telephone or network line, attached thereto.

Figure 2:
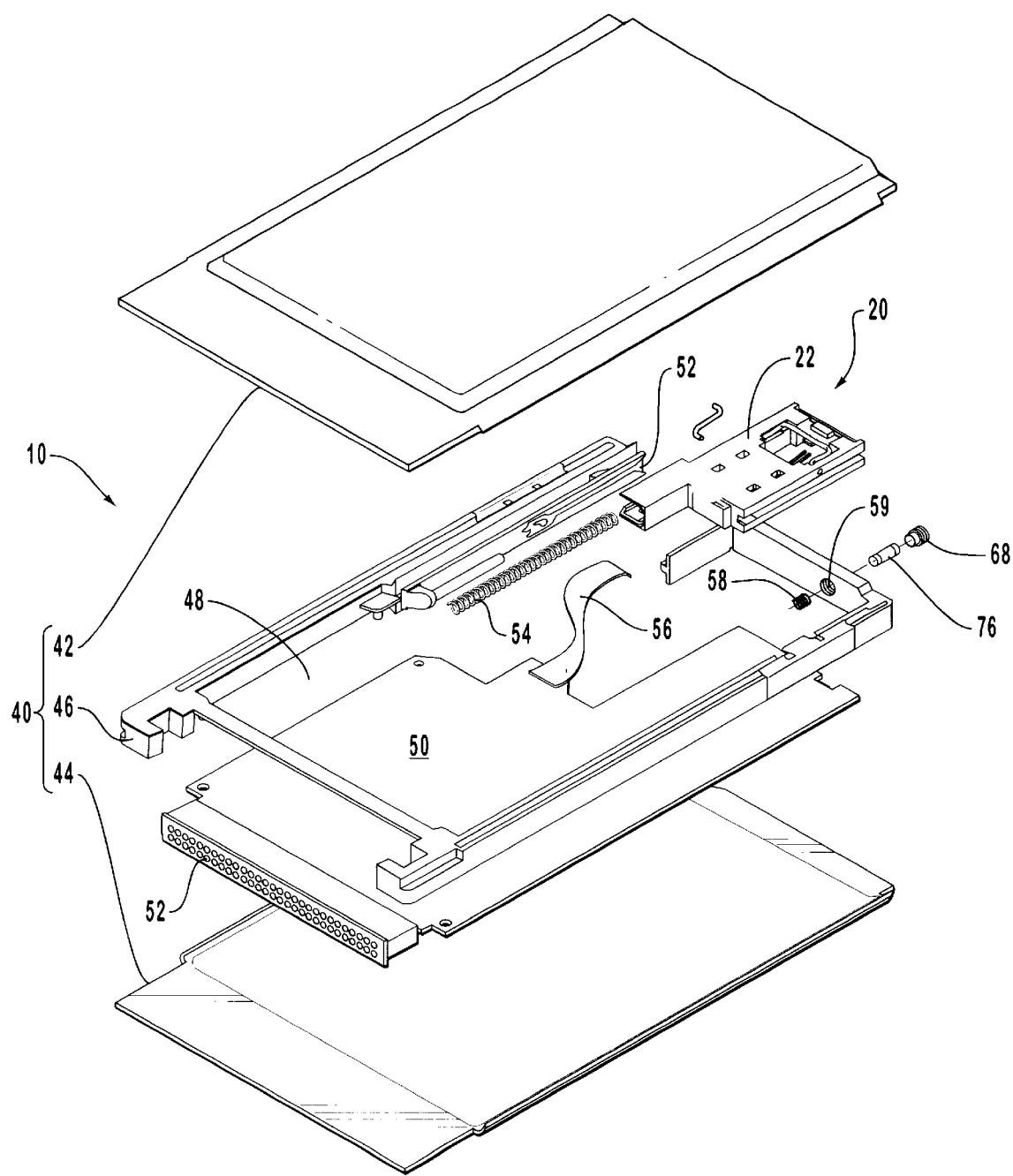
FIG. 2 is a perspective view of the PC card shown in FIG. 1 in a disassembled configuration.

Depicted in FIG. 2, PC card 10 includes a housing 40. Housing 40 comprises a top cover plate 42, a bottom cover plate 44, and a border frame 46 that is positioned therebetween. Typically, although not necessarily, cover plates 42 and 44 are metallic whereas border frame 46 is molded from plastic. One or more of the parts of housing 40 can be integrally molded together or otherwise secured together by screws, adhesive, and the like.

Housing 40 bounds a compartment 48 in which a circuit board 50 disposed. The circuitry on circuit board 50 is dependent upon the type and intended use of PC card 10. Mounted in electrical communication with circuit board 50 is an electrical connector 52. Electrical connector 52 is configured for coupling PC card 10 in electrical communication with an associated electrical apparatus. By way of example and not by limitation, in one embodiment electrical connector 52 comprises a 64-pin connector. A variety of other conventional types of electrical connectors can also be used.

Slide plate 22 of retractable jack 20 is slidable mounted on a side rail 52 of border frame 46 and is biased by a spring 54 so as to selectively project into the extended position. A flexible wire ribbon 56 extends between circuit board 50 and slide plate 22. Wire ribbon 56 enables slide plate 22 to maintain electrical communication with circuit board 50 as slide plate 22 is selectively moved between the extended and retracted position. A variety of alternative embodiments with regard to retractable jack 20 and how it is electrically coupled with circuit board 50 are disclosed in U.S. Pat. No. 5,547,401, filed Aug. 16, 1994, and U.S. patent application Ser. No. 08/976,819, filed Nov. 24, 1997, which for purposes of disclosure are incorporated herein by specific reference.

In one embodiment of the present invention, means are provided for housing a fuse in electrical communication with circuit board 50 such that the fuse can be selectively removed and replaced without disassembly of housing 40. In general terms, the means for housing a fuse comprises a fuse slot formed on PC card 10. The fuse slot is configured to receive a fuse and communicates with the exterior through an opening. Disposed within the fuse slot is a pair of spaced apart fuse contacts. Each of the fuse contacts are disposed in electrical communication with the circuit board. The fuse contacts are configured to engage opposing ends of the fuse so that circuit board 50 is in electrical communication with the fuse when the fuse is disposed within the fuse slot. When a power surge or unspecified voltage is applied to circuit board 50, the fuse is burned out or otherwise blown, thereby preventing damage to circuit board 50 and the electrical lines and equipment coupled therewith.

It is appreciated that the inventive fuse slot and related fuse contacts can be located at a variety of different locations on PC card 10 and can have a variety of different configuration. By way of general example and not by limitation, the fuse slot can be formed on border frame 46, on circuit board 50, between border frame 46 and circuit board 50, between one of cover plates 42, 44 and circuit board 50, and combinations thereof. Furthermore, the fuse contacts can be mounted on border frame 46, circuit board 50, cover plates 42, 44, and combinations thereof.

The fuse slot and fuse contacts can also have a variety of different configurations and sizes to fit a variety of different types of fuses. The term "fuse" as used in the specification and appended claims is broadly intended to include all types of fuses which can be used on PC cards to protect the PC card and/or related lines and equipment. Examples of different types of fuses that can be used include surface mount fuses such as the MICRON GUARD™ MGA 125V quick-acting surface mount fuse available from Schurt; the NANOFUSE™, PICO™, and NONO$^2$™ subminiature surface mount fuses from Littlefuse; surface mount PTC 1812L series fuses from Littlefuse and thin-film surface mount fuses such as 1206 SMF available from Littlefuse.

Figure 3:
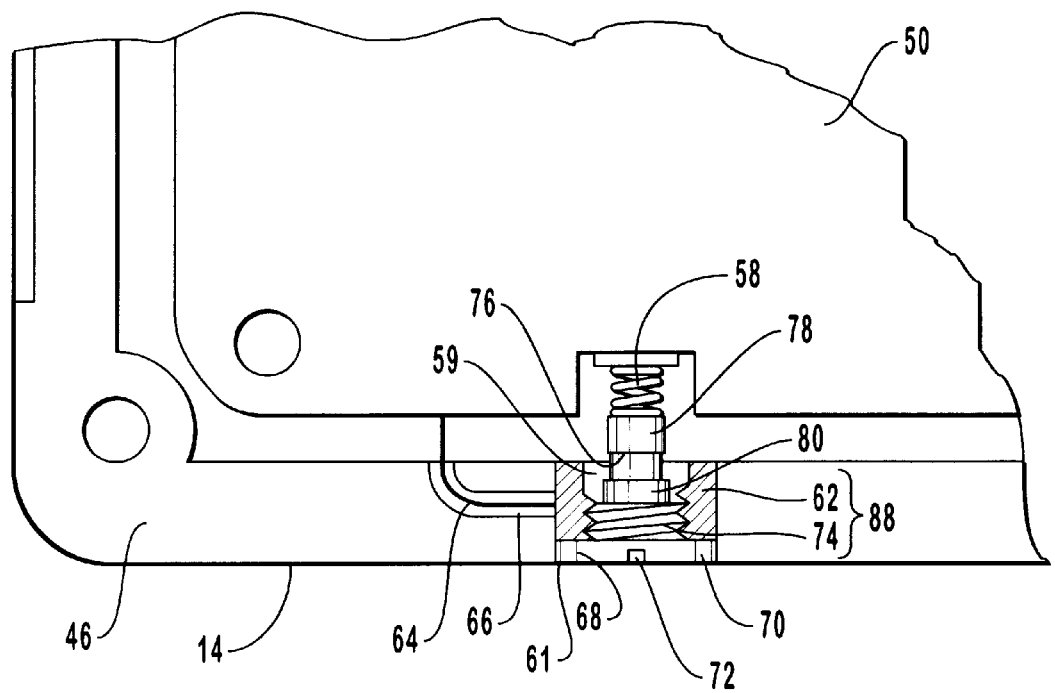
FIG. 3 is a cross-sectional top view of a portion of the PC card shown in FIG. 1 disclosing an removable fuse assembly.

Depicted in FIGS. 2 and 3 is one example of the means for housing a fuse in electrical communication with circuit board 50, As shown therein, a fuse slot 59 extends from front face 14 of border frame 46 to circuit board 50. An opening 61 formed at front face 14 allows a fuse 76 to be selectively inserted and removed from fuse slot 59 without disassembly of housing 40. Fuse 76 is depicted having a first end 78 and an opposing second end 80.

The present invention also includes means for electrically coupling fuse 76 with circuit board 50 when fuse 76 is selectively disposed within fuse slot 59. By way of example and not by limitation, a first fuse contact 58 is mounted on circuit board 50 and is in electrical communication therewith. First fuse contact 58 is configured to bias against first end 78 of fuse 76 when fuse 76 is disposed within fuse slot 59. In the embodiment depicted, first fuse contact 58 includes a spring.

Fuse contact 58 and the other fuse contacts disclosed herein can be of any desired configuration that will effect electrical communication with fuse 76. The type and configuration of fuse contacts used depends on the type of fuse 76 to be used. For example, fuse contacts can comprises exposed wires, solder joints, prongs, sockets, clips, threaded shafts, or more conventional metal plate contacts. In one embodiment, the fuse contacts are configured so as to securely retain fuse 76 within fuse slot 59. For example, at least one of the fuse contacts can be configured to produce a biasing force toward the opposing fuse contact. In this embodiment, the fuse contact can comprise a spring or bent plate which has resilient biasing properties. In yet other embodiments, the fuse contacts can comprise C-shape clamps or other clamping configurations for securely attaching to fuse 76.

A second fuse contact 88 is positioned to selectively bias in electrical engagement against second end 80 of fuse 76 when fuse 76 is received within fuse slot 59. As depicted in FIG. 3, second fuse contact 88 includes a threaded insert sleeve 62 secured within fuse slot 59, Sleeve 62 is made from metal or other conductive material. An electrical line 64 extends from sleeve 62 to circuit board 50. This can be accomplished by passing electrical line 64 through a groove 66 formed along border frame 46. In alternative embodiments, tunnels, channels, or other configurations can also be used to allow the placement of electrical line 64. Threadedly secured to sleeve 62 is a cap 68. Cap 68 includes a large head 78 which is either formed from a plastic or other electrically insulating material or is covered by such a material. A slot 72 formed on head 70 enables selective removal or attachment of cap 68 using a screw driver type apparatus.

Projecting from head 70 is a threaded shaft 74. Shaft 74 is either formed from or is coated with an electrically conductive material. As shaft 74 is screwed into sleeve 62, electrical communication is established therebetween. As shaft 74 is further advanced within sleeve 62, shaft 74 biases in electrical engagement against second end 80 of fuse 76, thereby effecting electrical communication between fuse 76 and sleeve 62. In turn, as previously discussed, sleeve 62 is in electrical communication with circuit board 50 through electrical line 64.

In this configuration, fuse 76 is in electrical communication with circuit board 50 so as to protect the electrical circuitry thereon and to protect the electrical lines and/or electrical equipment coupled therewith. Accordingly, should a power surge or under undesirable voltage be applied across fuse 76, fuse 76 will burn out so as to protect the various electrical equipment. A knife, screw driver, or other corresponding tool can then be used to selectively remove cap 68 from sleeve 62. Burned out fuse 76 can then be removed and a new fuse 76 replaced. Once cap 68 is replaced, PC card 10 will be back in operation.

One of the unique benefits of the present invention is that the replacement of fuse 76 can be easily performed by the average consumer without the need for substantial disassembly of PC card 10.

Figure 4:
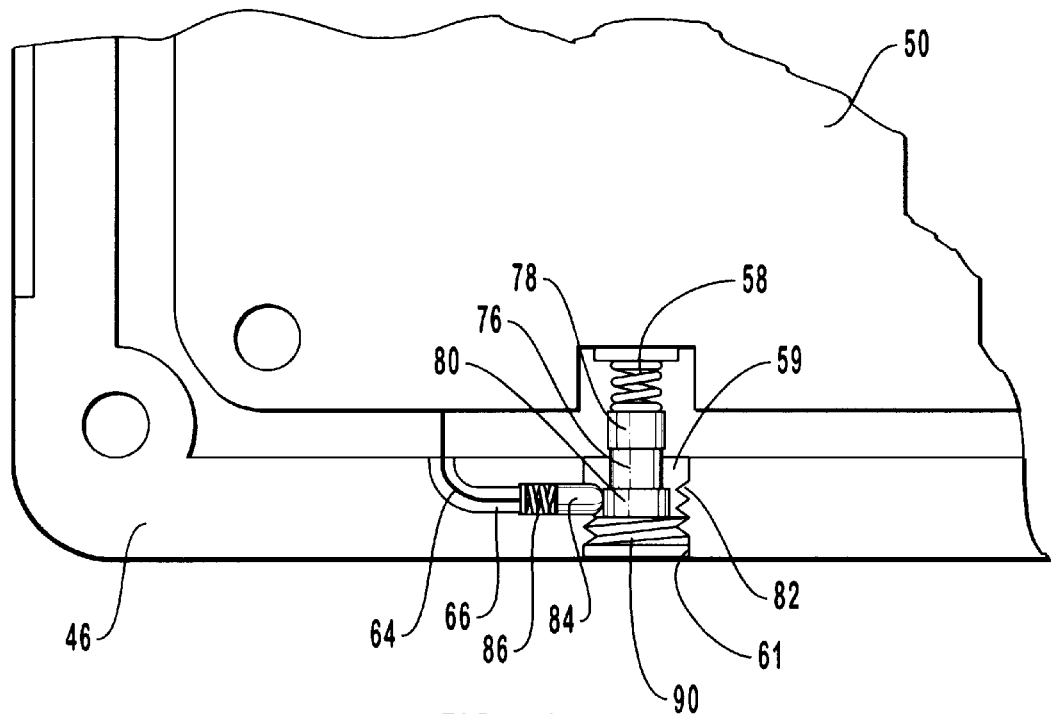
FIGS. 4–6 arc cross-sectional top views of the PC card shown in FIG. 1 depicting alternative embodiments of the removable fuse assembly.

Depicted in FIG. 4 is another example of means for housing fuse 76 in electrical communication with circuit board 50. As disclosed therein, fuse slot 59 again extends through border frame 46 in alignment with first fuse contact 58. In this embodiment, however, fuse slot 59 is formed having an integral threaded sidewall 82. A fuse contact 84 is biased by a spring 86 so as to project through sidewall 82 into fuse slot 59. Fuse contact 84 is in electrical communication with circuit board 50 by way of electrical line 64. A threaded cap 90, made of an electrically insulative material, is selectively screwed into opening 61 of fuse slot 59 so as to retain fuse 76 therein. In this embodiment, fuse contact 84 is biased against second end 80 of fuse 76 so as to facilitate electrical communication between fuse 76 and circuit board 50.

Figure 5:
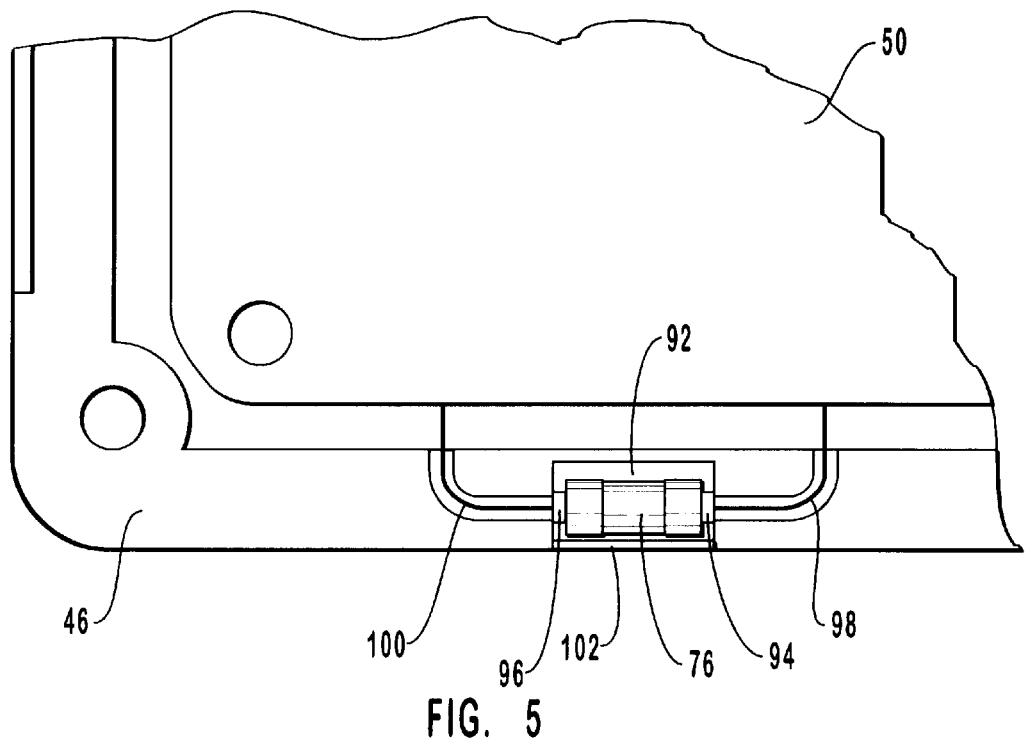

In yet another alternative embodiment, depicted in FIG. 5 is a longitudinal fuse slot 92 formed on border frame 46. Disposed within fuse slot 92 is a first fuse contact 94 and an opposing second fuse contact 96. First fuse contact 94 is disposed in electrical communication with circuit board 50 through a first electrical line 98 while second fuse contact 96 is disposed in electrical communication with circuit board 50 through a second electrical line 100. Fuse contacts 94 and 96 are configured to receive fuse 76 therebetween. A cover 102 is removable mounted over an opening to fuse slot 92. Cover 102 can comprise a sheet of electrically non-conductive material, such as plastic or paper, which can be secured by an adhesive. Alternatively, cover 102 can comprise a hinged or other selectively openable cover mounted on border frame 46.

Figure 6:
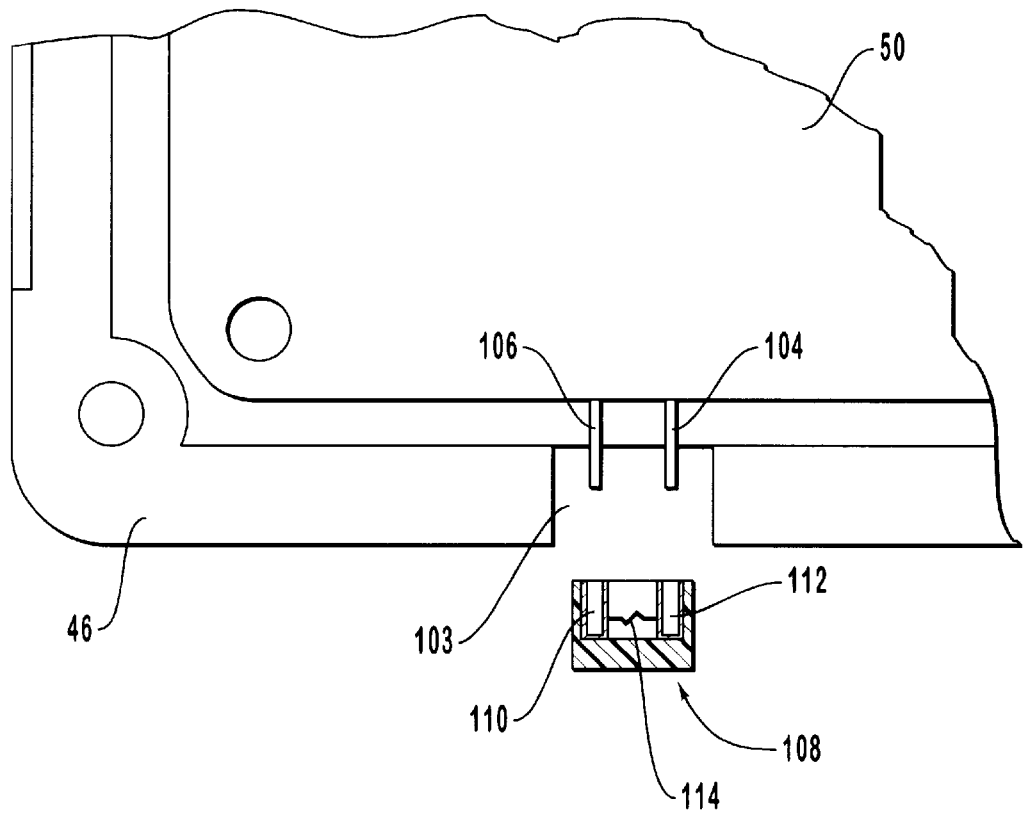

Finally, in yet another alternative embodiment depicted in FIG. 6, a fuse slot 104 is formed on border frame 46. As previously discussed, fuse slot 104 can also be formed at other locations along border frame 46 and through one of cover plates 42 or 44. Projecting from circuit board 50 into slot 104 are a pair of spaced apart contact prongs 104 and 106. Contact prongs 104 and 106 are disposed in electrical communication with circuit board 50. A jumper or otherwise modular fuse 108 includes a pair of contact sockets 110 and 112 having a fuse element 114 disposed therebetween. During use, modular fuse 108 is received within fuse slot 103 such that contact prongs 106 and 108 are received in electrical communication within corresponding contact sockets 110 and 112. Should fuse element 114 burn out, modular fuse 108 can then be easily removed and replaced.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A PC card operable with a fuse, the PC card comprising:
   (a) a housing bounding a compartment;
   (b) a circuit board disposed within the compartment; and
   (c) means for housing the fuse within the housing in electrical communication with a pair of fuse contacts in direct electrical communication with the circuit board such that the fuse can be individually selectively removed and replaced without disassembly of the housing.

2. A PC card as recited in claim 1, wherein the means for housing the fuse comprises a fuse slot formed at least partially on the housing, the fuse slot being configured to receive the fuse, the fuse slot communicating with the exterior through an opening.

3. A PC card as recited in claim 2, further comprising a pair of fuse contacts disposed within the fuse slot.

4. A PC card as recited in claim 3, wherein at least one of the fuse contacts is mounted on the circuit board.

5. A PC card as recited in claim 3, wherein at least one of the fuse contacts is mounted on the housing.

6. A PC card as recited in claim 2, further comprising means for selectively covering the opening to the fuse slot.

7. A PC card comprising:
   (a) a housing bounding a compartment;
   (b) a circuit board disposed within the compartment;
   (c) a fuse slot formed at least partially on the housing; and
   (d) a pair of spaced apart fuse contacts disposed within the fuse slot in direct electrical communication with the circuit board.

8. A PC card as recited in claim 7, wherein the housing comprises a top cover plate, a bottom cover plate, and a border frame extending therebetween, the fuse slot being at least partially formed on the border frame.

9. A PC card as recited in claim 7, wherein at least a one of the fuse contacts is mounted on the housing.

10. A PC card as recited in claim 7, wherein one of the fuse contacts comprises:

(a) a threaded metal sleeve disposed within the fuse slot, the metal sleeve being disposed in electrical communication with the circuit board; and (b) a cap having a threaded shaft configured to threadedly engage the metal sleeve, at least a portion of the shaft being comprised of an electrically conductive material.

11. A PC card as recited in claim 7, further comprising:

(a) the fuse slot having a threaded interior surface; and (b) an electrically non-conductive cap configured to be threadedly received within the fuse slot.

12. A PC card as recited in claim 7, further comprising a retractable jack disposed in electrical communication with the circuit board.

13. A PC card as recited in claim 7, wherein at least one of the fuse contacts comprises a spring.

14. A PC card comprising:

(a) a housing comprising a top cover plate, a bottom cover plate, and a border frame extending therebetween, the housing bounding a compartment;

(b) a circuit board disposed within the compartment;

(c) an electrical connector mounted on the housing in electrical communication with the circuit board;

(d) a fuse slot formed at least partially on the border frame, the fuse slot having an opening accessible from the exterior of the housing;

(e) a fuse configured to be individually removably disposed within the fuse slot; and (f) means for electrically coupling the fuse within the housing directly with the circuit board when the fuse is selectively disposed within the fuse slot.

15. A PC card as recited in claim 14, wherein the means for electrically coupling comprises a pair of spaced apart fuse contacts disposed within the fuse slot, the fuse contacts being configured to receive the fuse therebetween.

16. A PC card as recited in claim 14, wherein the means for electrically coupling comprises a fuse contact disposed within the fuse slot in electrical communication with the circuit board, the fuse contact being configure to produce a resilient biasing force against the fuse when the fuse is received within the fuse slot.

17. A PC card as recited in claim 14, wherein the means for electrically coupling comprises:

(a) a pair of contact prongs projecting into the fuse slot; and (b) the fuse comprising a pair of contact sockets configured to receive the contact prongs.

18. A PC card as recited in claim 14, wherein the means for electrically coupling comprises a fuse contact mounted on the border frame in communication with the fuse slot.

19. A PC card as recited in claim 14, wherein the circuit board has modem circuitry disposed thereon.

20. A PC card as recited in claim 14, further comprising means for facilitating electrical communication between the circuit board and an electrical cable.

* * * * *

UNITED STATES PATENT AND TRADEMARK OFFICE
CERTIFICATE OF CORRECTION

PATENT NO. : 6,205,030 B1  
DATED : March 20, 2001  
INVENTOR(S) : Tim Urry Price Page 1 of 1

It is certified that error appears in the above-identified patent and that said Letters Patent is hereby corrected as shown below:

Column 2,  
Line 51, please change "disclosing an removable" to -- disclosing a removable --  
Line 53, please change "arc cross-sectional" to -- are cross-sectional --

Column 3,  
Line 31, please change "connectors Card" to -- connectors. Card --

Column 4,  
Line 21, please change "ration. By" to -- rations. By --  
Line 44, please change "50, As" to -- 50. As --  
Line 63, please change "can comprises" to -- can comprise --

Column 5,  
Line 40, please change "or under" to -- or another --

Column 6,  
Line 8, please change "is removable" to -- is removably --

Signed and Sealed this

Twelfth Day of March, 2002

Attest:

*Attesting Officer*

JAMES E. ROGAN  
*Director of the United States Patent and Trademark Office*